United States Patent [19]
Park et al.

[11] Patent Number: 5,854,107
[45] Date of Patent: Dec. 29, 1998

[54] METHOD FOR FORMING CAPACITOR OF SEMICONDUCTOR DEVICE

[75] Inventors: Cheol Soo Park; Dae Young Kim, both of Kyoungki-do, Rep. of Korea

[73] Assignee: Hyundai Electronics Industries Co., Ltd., Ichon-shi, Rep. of Korea

[21] Appl. No.: 924,843

[22] Filed: Sep. 5, 1997

[30] Foreign Application Priority Data

Sep. 9, 1996 [KR] Rep. of Korea .................. 1996 38863

[51] Int. Cl.⁶ ............................................. H01L 21/8242
[52] U.S. Cl. ........................................... 438/254; 438/397
[58] Field of Search .................................... 438/238–239, 438/255–254, 381, 396–397

[56] References Cited

U.S. PATENT DOCUMENTS

| | | | |
|---|---|---|---|
| 5,097,381 | 3/1992 | Vo | 361/313 |
| 5,346,844 | 9/1994 | Cho et al. | 437/52 |
| 5,629,540 | 5/1997 | Roh et al. | 257/306 |
| 5,688,713 | 11/1997 | Linliu et al. | 437/60 |
| 5,691,227 | 11/1997 | Kim | 437/60 |

*Primary Examiner*—Joni Chang
*Attorney, Agent, or Firm*—Thelen Reid & Priest LLP

[57] ABSTRACT

A method for forming a capacitor of a semiconductor device, by which a three dimensional structure of a storage electrode occupying small space but having a great surface area is formed between word lines or bit lines. According to the method, an additional planarization layer is not formed on the word lines or the bit lines, so as to make the three dimensional structure high. Thus, the storage electrode comes to have an enlarged surface area enough to allow the formation of a capacitor with a sufficient capacitance for the high integration of semiconductor devices and thus to improve the properties and the reliability of semiconductor devices.

15 Claims, 6 Drawing Sheets

METHOD FOR FORMING CAPACITOR OF SEMICONDUCTOR DEVICE

BACKGROUND OF THE INVENTION

1. Field of the Invention

The present invention relates to a method for forming a capacitor of a semiconductor device. More particularly, the present invention relates to a method by which a high cylindrical capacitor connecting to a semiconductor substrate is formed irrespectively of whether a contact plug is formed or not, thereby securing a capacitance enough for the high integration of semiconductor devices.

2. Description of the Prior Art

Generally, the high integration of semiconductor devices is accompanied by the reduction of cell in size, making it difficult to secure enough capacitance, which is proportional to the surface area of storage electrode. Particularly in the case of DRAM devices, which have a unit cell that consists of a MOS transistor and a capacitor, a pivotal point to highly integrate them is to reduce the size of the capacitor while augmenting its capacitance because it occupies much space in the chip.

The capacitance of a capacitor is represented by the following formula:

$$C=(E_o \times E_r \times A)/T$$

wherein $E_o$ is a dielectric constant in vacuum, $E_r$ is a dielectric constant of dielectric film, A is the surface area of a storage electrode, and T is the thickness of dielectric film. Typically, the capacitance C has been increased by widening the surface area of the storage electrode in three-dimension. However, this three-dimensional increase results in making the whole fabrication procedure of semiconductor devices complicated, which is another obstacle to their high integration.

In order to better understand the background of the invention, a description will be given of the conventional method for forming a capacitor of a semiconductor device.

First, a word line is formed on a semiconductor substrate, followed by the formation of a first planarization layer on the word line. The planarization layer is opened by an etching process utilizing a bit line contact mask, to form a bit line contact hole through which the semiconductor substrate is exposed. Thereafter, a bit line is formed which is connected through the bit line contact hole to the semiconductor substrate. Over the resulting structure a blanket of a second planarization layer is laid. A storage electrode contact hole is formed to expose the semiconductor substrate, followed by the formation of a three-dimensional structure of a capacitor which is connected through the storage electrode contact hole to the semiconductor substrate. Alternatively, the capacitor can be formed prior to the formation of the bit line.

The above conventional method, however, is found to be unable to bestow enough capacitance to create very highly integrated semiconductor devices.

An alternate method for increasing the capacitance of a storage electrode is to control the parameters relating to the dielectric film used. For example, a ferroelectric film, which is high in dielectric constant $E_r$ such as tantalum oxide ($Ta_2O_5$), BST (($Ba,Sr$)$TiO_3$), or PZT ($Pb(ZrI-XTiX)O_3$), is used for the dielectric film with the thickness T being small. Such dielectric films with high dielectricity allows the high integration of semiconductor devices but hillocks and pin holes occur on the surface of the storage electrode, causing problems including instability in electrical properties and lack of reproductivity.

In order to solve these problems, the lower and the upper electrodes of a capacitor are made of a superconductor selected from ruthenium oxide ($RuO_2$), platinum (Pt), iridium oxide ($IrO_2$) or $YBaCuO_3$ and stabilized prior to use. However, when high dielectric constant materials, such as BST and PZT, are made into thin films, the dielectric constant is significantly reduced, to lower the capacitance of the capacitor to be formed later.

As mentioned above, the prior techniques are now found to be insufficient in securing capacitance enough for the high integration of semiconductor devices.

SUMMARY OF THE INVENTION

Therefore, it is an object of the present invention to overcome the above problems encountered in prior arts and to provide a method for forming a capacitor of a semiconductor device, by which a storage electrode higher than word lines or bit lines is formed therebetween in such a three dimensional pattern that it occupies small space but has an enlarged surface area enough to allow the formation of the capacitor with a sufficient capacitance for the high integration of semiconductor devices and thus to improve the properties and the reliability of semiconductor device.

In accordance with an aspect of the present invention, there is provided a method for forming a capacitor of a semiconductor device, comprising the steps of: planarizing a structure formed on a semiconductor substrate; forming a first storage electrode contact hole through which a predetermined region of the semiconductor substrate is exposed and a bit line contact hole, at once; burying the first storage electrode contact hole and bit line contact hole with a first conductive layer, to form a contact plug; laying a first insulating film at a predetermined thickness entirely on the resulting structure and forming a bit line over the first insulating film; forming a second insulating film at a predetermined thickness entirely over the resulting structure; depositing a blanket of a third insulating film to planarize the second insulating film; executing a self alignment contact etch process to form a second storage electrode contact hole through which the contact plug of the first storage electrode contact hole is exposed; forming a second conductive layer at a predetermined thickness entirely over the resulting structure; forming a spacer of a fourth insulating film at the side wall of the second storage electrode contact hole; burying the second storage electrode contact hole with a third conductive layer; subjecting the second and the third conductive layers and the fourth insulating film to planarization etch until the third insulating film is exposed; and eliminating the third insulating film and the fourth insulating film present within the second storage electrode contact hole, to create a storage electrode with a great surface area.

In accordance with another aspect of the present invention, there is provided a method for forming a capacitor of a semiconductor device, comprising the steps of: planarizing a structure formed on a semiconductor substrate; forming a first storage electrode contact hole through which a predetermined region of the semiconductor substrate is exposed and a bit line contact hole, at once; burying the first storage electrode contact hole and bit line contact hole with a first conductive layer, to form a contact plug; laying a first insulating film at a predetermined thickness entirely on the resulting structure and forming a bit line over the first insulating film; forming a second insulating film at a predetermined thickness entirely over the resulting structure; depositing a blanket of a third insulating film to planarize the second insulating film; forming an etch barrier layer over the third insulating film; executing a self alignment contact etch process to form a second storage electrode contact hole through which the contact plug of the first storage electrode contact hole is exposed; forming a second conductive layer at a predetermined thickness entirely over the resulting structure; forming a spacer of a fourth insulating film at the side wall of the second storage electrode contact hole; burying the second storage electrode contact hole with a third conductive layer; subjecting the second and the third conductive layers and the fourth insulating film to planarization etch until the third insulating film is exposed; and eliminating the third insulating film and the fourth insulating film present within the second storage electrode contact hole, to create a storage electrode with a great surface area.

In accordance with a further aspect of the present invention, there is provided a method for forming a capacitor of a semiconductor device, comprising the steps of: constructing a word line on a semiconductor substrate; forming an insulating film spacer at the side wall of the word line; depositing a first insulating film at a predetermined thickness entirely over the resulting structure; forming a blanket of a second insulating film to planarize the structure of the first insulating film; executing a self-alignment contact etch process to form a storage electrode contact hole through which a predetermined region of the semiconductor substrate is exposed; forming a first conductive layer at a predetermined thickness entirely over the resulting structure; forming a spacer of a third insulating film at the side wall of the storage electrode contact hole; burying the storage electrode contact hole with a second conductive layer; subjecting the first and the second conductive layers and the insulating film to planarization etch until said second insulating film is exposed; and eliminating the second insulating film and the third insulating film present within the second storage electrode contact hole, to create a storage electrode with a great surface area.

In accordance with another aspect of the present invention, there is provided a method for forming a capacitor of a semiconductor device, comprising the steps of: constructing a word line on a semiconductor substrate; forming an insulating film spacer at the side wall of the word line; depositing a first insulating film at a predetermined thickness entirely over the resulting structure; forming a blanket of a second insulating film to planarize the structure of the first insulating film; forming an etch barrier layer over the second insulating film; executing a self-alignment contact etch process to form a storage electrode contact hole through which a predetermined region of the semiconductor substrate is exposed; forming a first conductive layer at a predetermined thickness entirely over the resulting structure; forming a spacer of a third insulating film at the side wall of the storage electrode contact hole; burying the storage electrode contact hole with a second conductive layer; subjecting the first and the second conductive layers and the insulating film to planarization etch until said second insulating film is exposed; and eliminating the second insulating film and the third insulating film present within the second storage electrode contact hole, to create a storage electrode with a great surface area.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
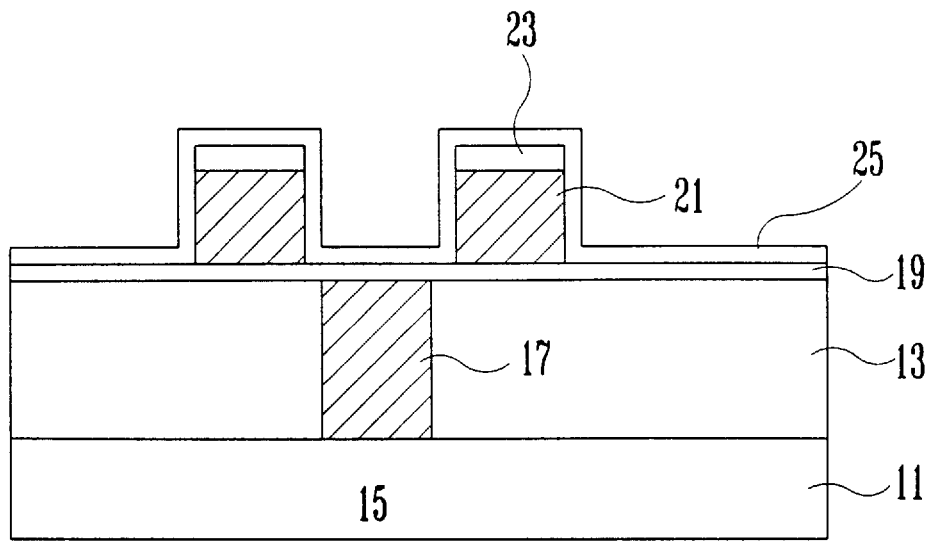
FIGS. 1a to 1e are schematic cross sectional views showing a method for forming a capacitor of a semiconductor device, in accordance with a first embodiment of the present invention.

The application of the preferred embodiments of the present invention is best understood with reference to the accompanying drawings, wherein like reference numerals are used for like and corresponding parts, respectively.

Referring to FIG. 1, a method for forming a capacitor of a semiconductor device is shown, according to a first embodiment of the present invention.

First, a blanket of a planarization layer 13 is laid over a semiconductor substrate 11 on which a word line (not shown) is formed, as shown in FIG. 1a. The planarization layer 13 is made of borophosphosilicate glass (hereinafter referred to as "BPSG") or tetraethylorthosilicate (hereinafter referred to as "TEOS").

The semiconductor substrate 11 is opened at predetermined regions by an etching process using a bit line contact mask (not shown) and a storage electrode contact mask (not shown), to form a first storage electrode contact hole 15 and a bit line contact hole (not shown) through which a source/drain junction region (not shown) is exposed.

Then, the bit line contact hole and the storage electrode contact hole 15 are buried with a first polysilicon film 17, to form a bit line contact plug and a storage electrode contact plug. For the burial, polysilicon is deposited entirely over the exposed surface and subjected to etch.

Over the resulting structure is laid a first insulating film 19 with a predetermined thickness. It is made of middle temperature oxide (hereinafter referred to as "MTO") or TEOS oxide.

A bit line 21 which is in contact with the bit line contact plug is formed and then, covered with a mask oxide 23 which is useful for the subsequent self-alignment process.

A second insulating film 25 with a predetermined thickness is formed at a predetermined thickness over the resulting structure, in order to enhance the insulating properties of the bit line 21. For the second insulating film, that, such as silicon nitride, which is different from the oxide in etch selection ratio may be employed.

Figure 1B:
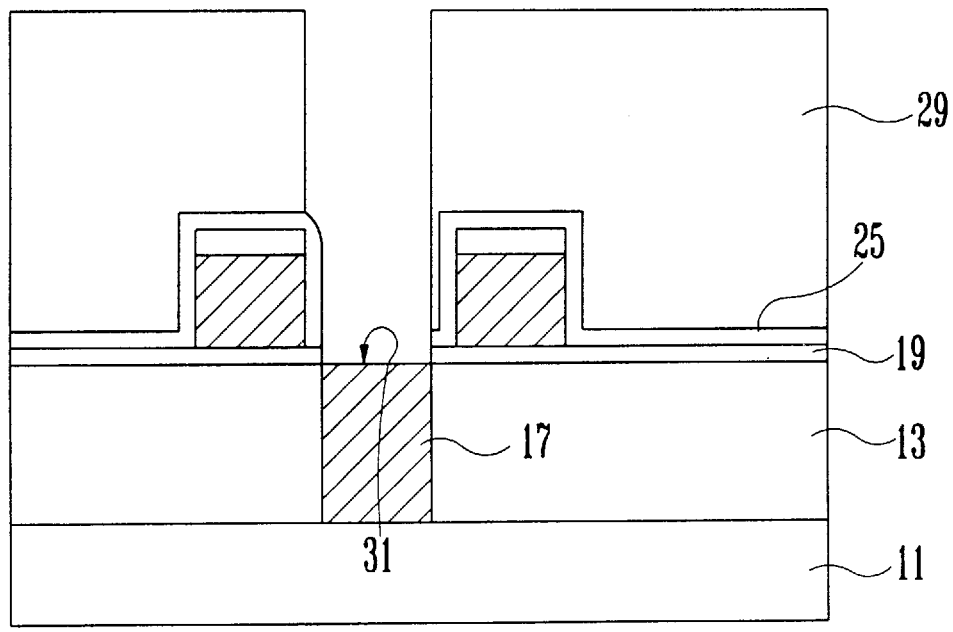

FIG. 1b is a cross section after a blanket of a third insulating film 29 is formed entirely over the structure of FIG. 1a, followed by the formation of a second storage electrode contact hole 31. The third insulating film 29 is about 1,000–10,000 Angstrom in thickness and must be different from the second insulating film in etch selection ratio, like BPSG oxide or plasma enhanced chemical vapor deposition (hereinafter referred to as "PECVD") oxide. A self-alignment contact etch process is used to form the second storage electrode contact hole 31 through which the storage electrode contact plug 17 is exposed.

Figure 1C:
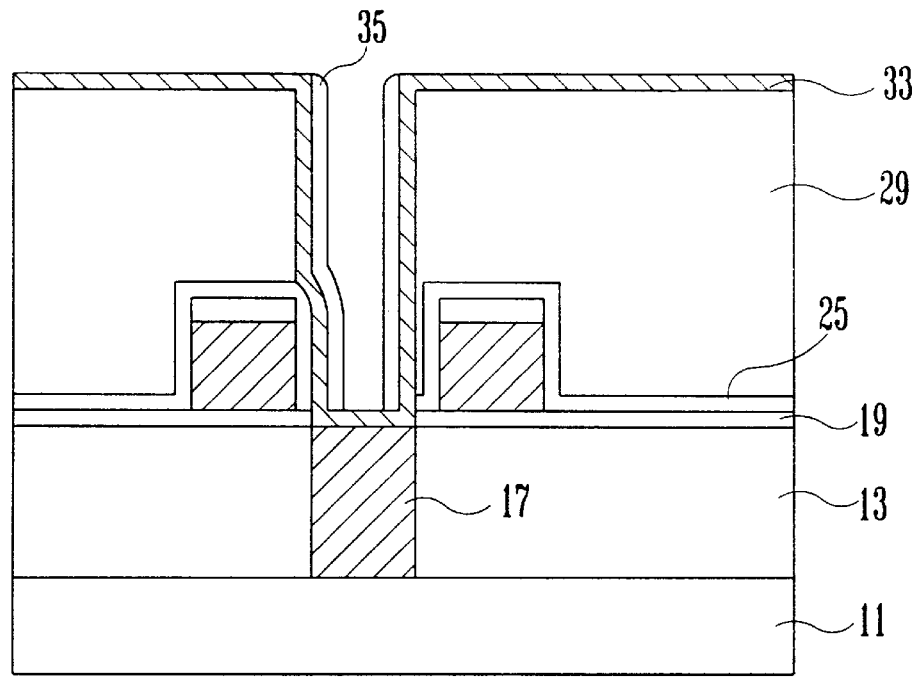

Then, as shown in FIG. 1c, the resulting structure is covered with a second polysilicon film 23 with a predetermined thickness, followed by the formation of a fourth insulating film 35, for example, an oxide, over the second polysilicon film 33. The fourth insulating film 35 is anisotropically etched to produce a spacer at the sidewall of the second contact hole 31.

Figure 1D:
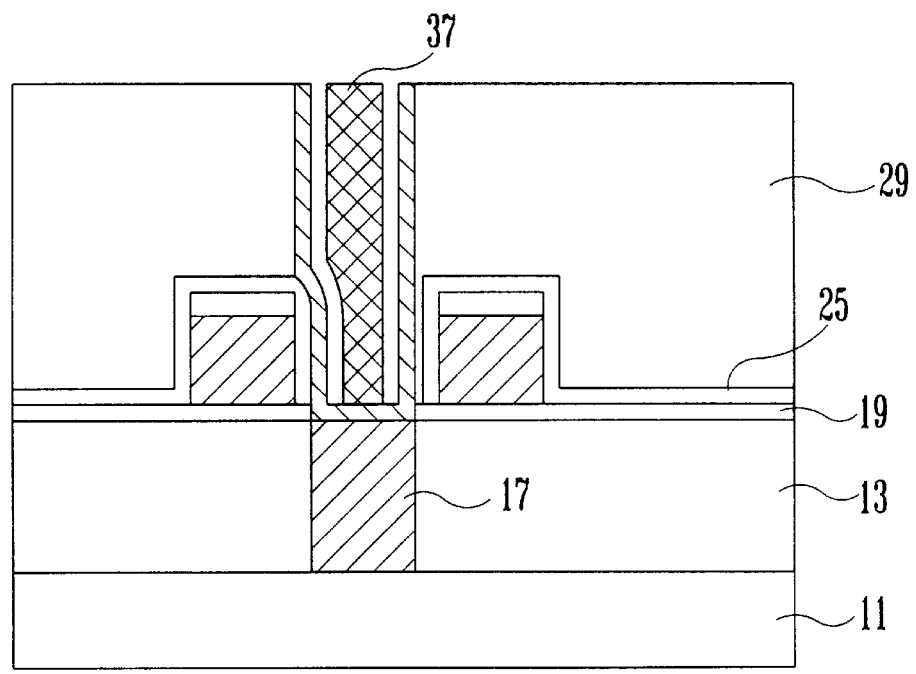

Thereafter, a third polysilicon film 37 is deposited at such a thickness as to fill the second storage electrode contact hole 31 and subjected to chemical mechanical polishing (hereafter referred to as "CMP") to the degree that the third insulating film 29 may be exposed, followed by the removal of the exposed fourth insulating film spacer 35, as shown in FIG. 1d. Taking advantage of the difference from the second and third polysilicon films 33 and 37 in etch selection ratio, the removal of the fourth insulating film spacer can be accomplished.

Figure 1E:
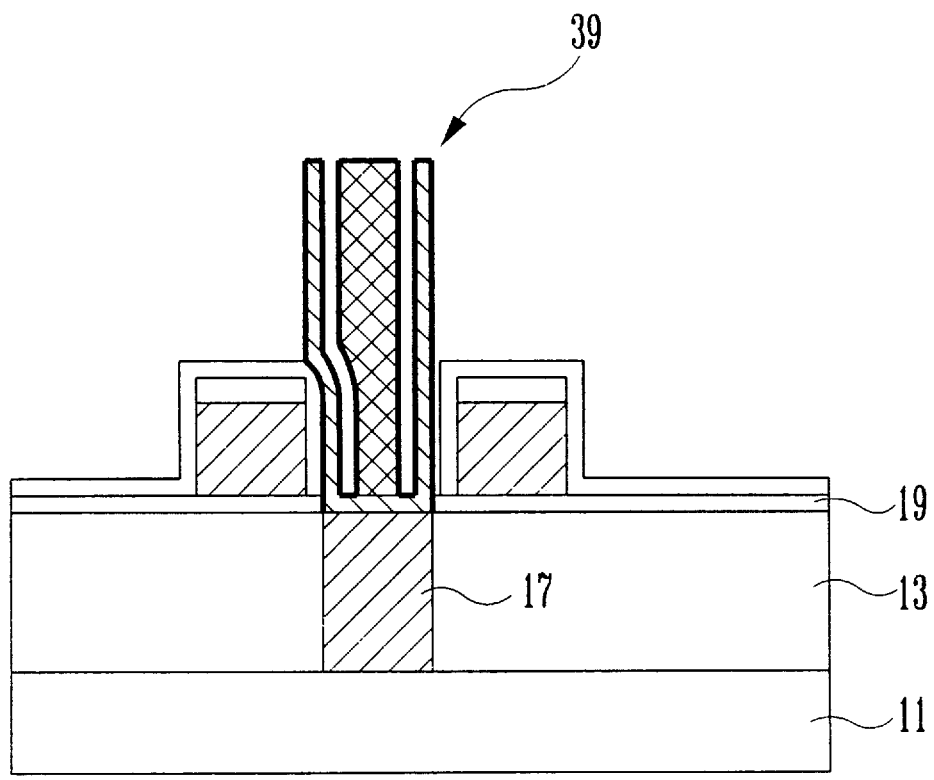

Likely, the third insulating film 29 is eliminated by using the difference in etch selection ratio from the second insulating film 25, for example, silicon nitride, formed on the bit line 21, as shown in FIG. 1e. As a result, a cylindrical storage electrode 39 1,000–10,000 Angstrom high, consisting of the first, the second and the third polysilicon films 17, 33 and 37, is formed between a pair of the bit lines 21 with its surface area being enlarged.

Alternatively, an etch barrier layer which differs in etch selection ratio from the third insulating film 29 and the second and the third polysilicon films 33 and 37, may be formed on the third insulating film 29 prior to the self-alignment contact etch process of FIG. 1b and then, the fourth insulating film spacer 35 may be eliminated by taking advantage of the difference in etch selection ratio. Also, in this case, a capacitor may be formed by producing a dielectric film and a plate electrode, the upper electrode, from the situation of FIG. 1d.

In addition, a multi-cylindrical storage electrode may be created by forming the conductive layer and the insulating layer as in FIG. 1c but many times with the uppermost being a conductive layer and by executing the CMP or etch process as in FIG. 1d.

Turning to FIG. 2, a method for forming a capacitor of a semiconductor device is shown, according to a second embodiment of the present invention.

Figure 2A:
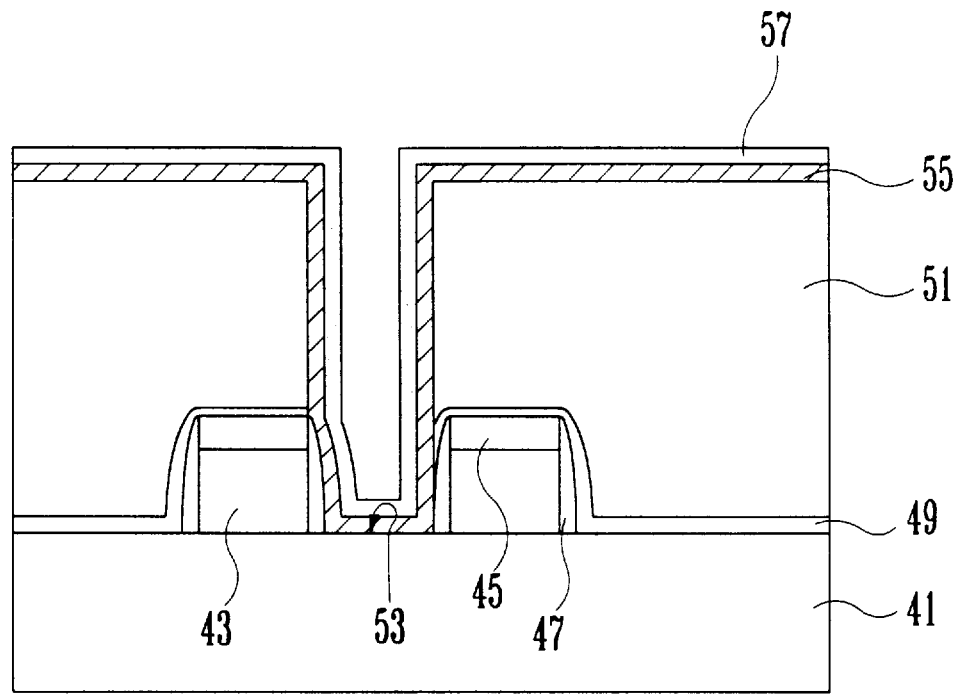
FIGS. 2a to 2e are schematic cross sectional views showing a method for forming a capacitor of a semiconductor device, in accordance with a second embodiment of the present invention.

First, there is prepared a semiconductor substrate 41 is prepared on which a word line 43 capped with a mask oxide 45 is formed and an insulating film spacer 47 stands at the side wall the word line 43 and the mask oxide 45 both offer, as shown in FIG. 2a.

Then, a first insulating film 49 with a predetermined thickness is laid over the resulting structure. This first insulating film 49 should be one which has a different etch selection ratio from the oxide film to be used in the subsequent processes and, for example, silicon nitride may be selected.

Subsequently, over the resulting structure is formed a blanket of a second insulating film 51 1,000–10,000 thick. It is should be different from the first insulating film in etch selection ratio, like BPSG oxide or PECVD oxide.

The second insulating film 51 is opened by an etch using a storage electrode contact mask, to form a storage electrode contact hole 53 through which a predetermined region, that is, a source/drain junction region (not shown) is exposed.

A first polysilicon film 55 is formed at a predetermined thickness over the resulting structure, followed by the formation of a third insulating film 57, for example, an oxide.

Figure 2B:
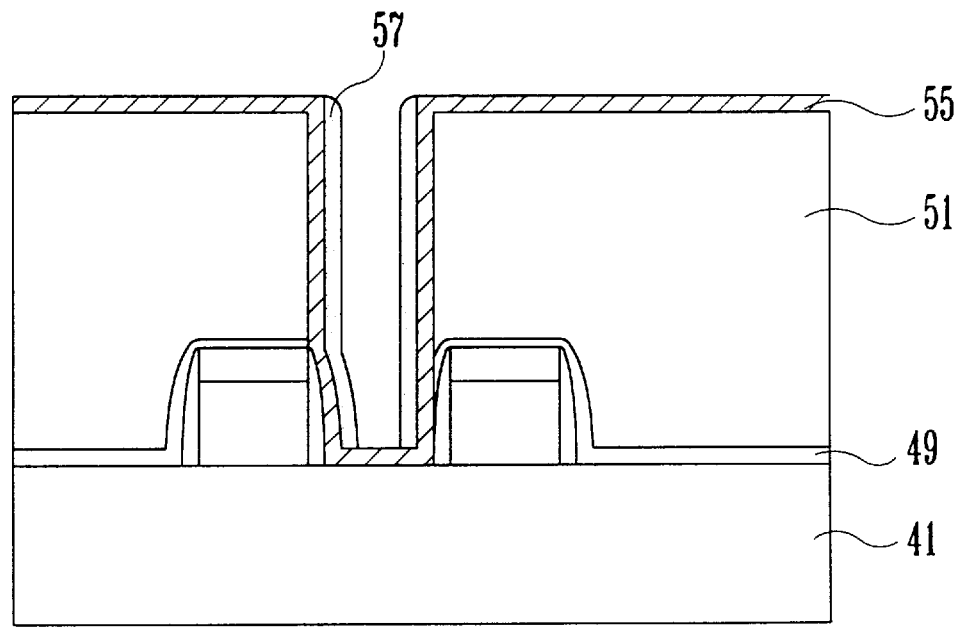

FIG. 2b is a cross section after the third insulating film 57 is anisotropically etched to produce a spacer at the sidewall of the first polysilicon film 55.

Figure 2C:
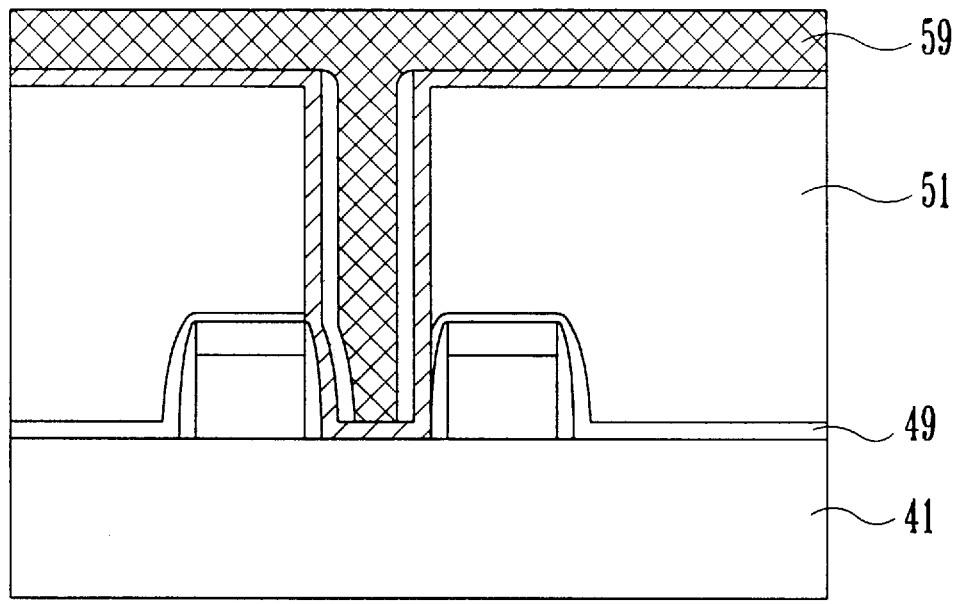

FIG. 2c is a cross section after a second polysilicon film 59 is deposited at such a thickness as to bury the storage electrode contact hole 53.

Figure 2D:
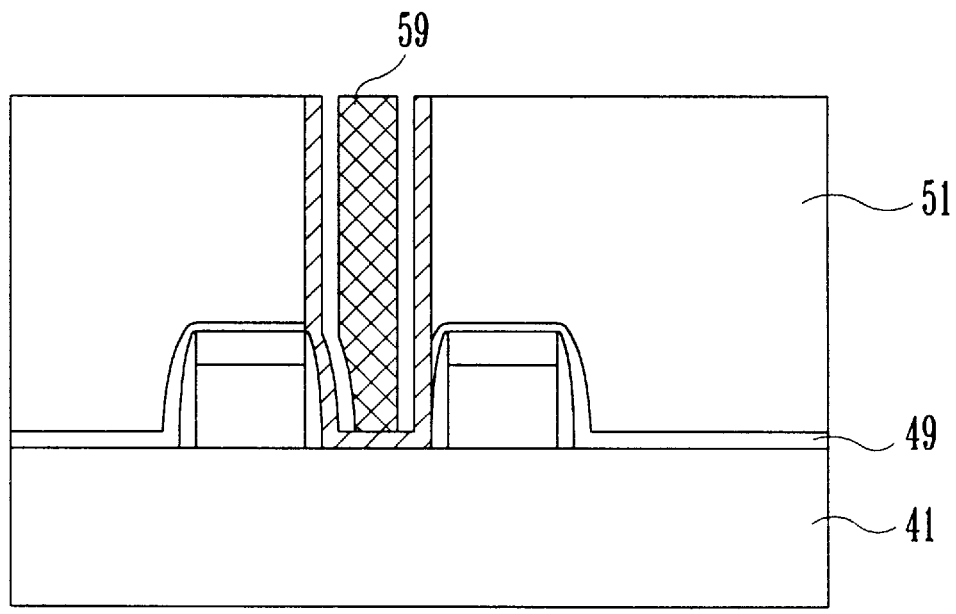

Thereafter, as shown in FIG. 2d, a CMP process is executed until the second insulating film 51 is exposed. Instead of the CMP process, a whole surface etch process is employed to remove the fist and the second polysilicon films 55 and 59. Then, the third insulating film spacer 57 is eliminated by taking advantage of the difference in etch selection ratio from the first and the second polysilicon films 55 and 59.

Figure 2E:
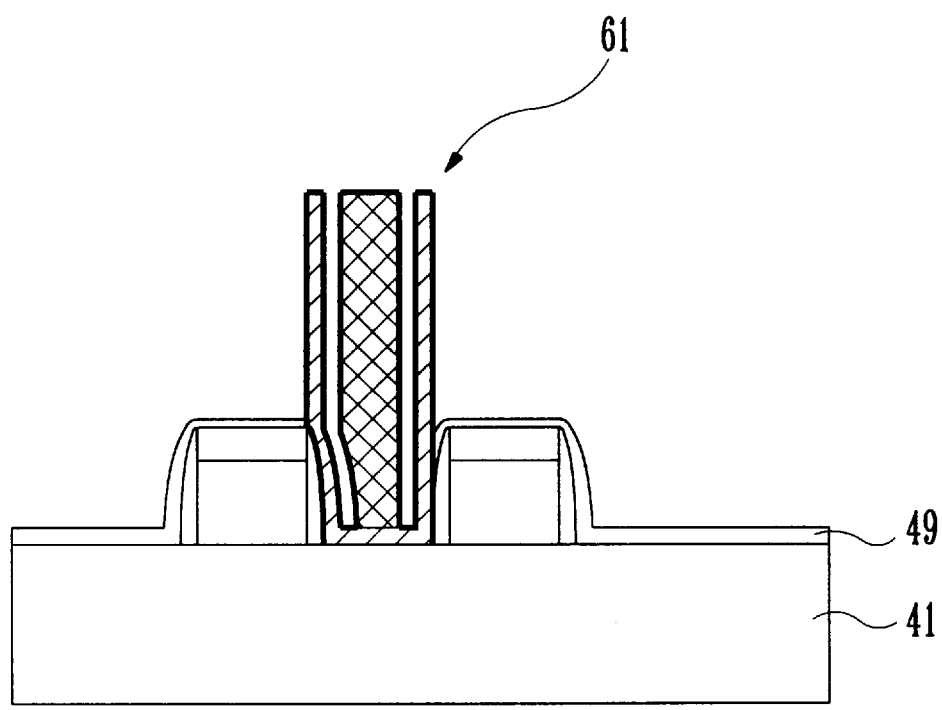

Likely, the second insulating film 51 is eliminated by a wet etch utilizing the difference in etch selection ratio from the second polysilicon film 59 and the first insulating film 49, as shown in FIG. 2e. As a result, a cylindrical storage electrode 59 1,000–10,000 Angstrom in height is formed with its surface area being enlarged.

Alternatively, an etch barrier layer which differs in etch selection ratio from the third insulating film 57 and the first and the second polysilicon films 55 and 59, may be formed on the second insulating film 51 prior to the self-alignment contact etch process described in FIG. 1b and then, the spacer from the third insulating film 57 may be eliminated by taking advantage of the difference in etch selection ratio. Also, in this case, a capacitor may be formed by producing a dielectric film and a plate electrode, the upper electrode, from the situation of FIG. 2d.

In addition, a multi-cylindrical storage electrode may be created by forming the conductive layer and the insulating layer as in FIG. 2a but many times until the storage electrode contact hole 53 is buried while the uppermost being a conductive layer and by executing the CMP or etch process as in FIG. 2d.

As described hereinbefore, the method for forming a capacitor of a semiconductor device, according to the present invention is characterized by a storage electrode higher than word lines or bit lines is formed therebetween in such a three dimensional pattern that it occupies small space but has an enlarged surface area enough to allow the formation of a capacitor with a sufficient capacitance for the high integration of semiconductor devices and thus to improve the properties and the reliability of semiconductor device.

The present invention has been described in an illustrative manner, and it is to be understood the terminology used is intended to be in the nature of description rather than of limitation.

Many modifications and variations of the present invention are possible in light of the above principles. Therefore, it is to be understood that within the scope of the appended claims, the invention may be practiced otherwise than as specifically described.

What is claimed is:

1. A method for forming a capacitor of a semiconductor device, comprising the steps of:

planarizing a structure formed on a semiconductor substrate;

forming a first storage electrode contact hole through which a region of the semiconductor substrate is exposed and a bit line contact hole, at once;

burying the first storage electrode contact hole and bit line contact hole with a first conductive layer, to form a contact plug;

laying a first insulating film at a thickness entirely on the resulting structure from the previous step and forming a bit line over the first insulating film;

forming a second insulating film at a thickness entirely over the resulting structure from the previous step;

depositing a blanket of a third insulating film to planarize the second insulating film;

executing a self alignment contact etch process to form a second storage electrode contact hole through which the contact plug of the first storage electrode contact hole is exposed;

forming a second conductive layer at a thickness entirely over the resulting structure from the previous step;

forming a spacer of a fourth insulating film at a side wall of the second storage electrode contact hole;

burying the second storage electrode contact hole with a third conductive layer;

subjecting the second and the third conductive layers and the fourth insulating film to planarization etch until the third insulating film is exposed; and eliminating the third insulating film and the fourth insulating film present within the second storage electrode contact hole, to create a storage electrode with a great surface area.

2. A method in accordance with claim 1, wherein said planarizing step is accomplished by forming a borophosphosilicate glass insulating film or a tetraethylorthosilicate insulating film over said structure.

3. A method in accordance with claim 1, wherein said first insulating film is formed of a middle temperature oxide or a tetraethylorthosilicate oxide.

4. A method in accordance with claim 1, wherein said bit line is capped with a mask insulating film.

5. A method in accordance with claim 1, wherein said second insulating film is an insulator which differs from an oxide in etch selection ratio.

6. A method in accordance with claim 1, wherein said third insulating film is selected from the group consisting of a borophosphosilicate glass insulating film, a silicon oxide and a plasma enhanced chemical vapor deposition oxide.

7. A method in accordance with claim 1, wherein said third insulating film ranges, in thickness, from about 1,000 to 10,000 Angstrom.

8. A method in accordance with claim 1, wherein said fourth insulating film is formed of an oxide.

9. A method in accordance with claim 1, wherein said planarization etch is accomplished by a chemical mechanical polishing process.

10. A method in accordance with claim 1, wherein said planarization etch is accomplished by a whole surface-etching process.

11. A method in accordance with claim 1, wherein said third insulating film is eliminated by taking advantage of the difference in etch selection ratio from the second and the third conductive layers and the second insulating film.

12. A method in accordance with claim 1, wherein said second conductive layer and said fourth insulating film are alternatively formed many times to make a multi-layer structure whose uppermost layer is conductive, prior to the formation of said third conductive layer.

13. A method for forming a capacitor of a semiconductor device, comprising the steps of:

planarizing a structure formed on a semiconductor substrate;

forming a first storage electrode contact hole through which a region of the semiconductor substrate is exposed and a bit line contact hole, at once;

burying the first storage electrode contact hole and bit line contact hole with a first conductive layer, to form a contact plug;

laying a first insulating film at a thickness entirely on the resulting structure from the previous step and forming a bit line over the first insulating film;

forming a second insulating film at a thickness entirely over the resulting structure from the previous step;

depositing a blanket of a third insulating film to planarize the second insulating film;

forming an etch barrier layer over the third insulating film;

executing a self alignment contact etch process to form a second storage electrode contact hole through which the contact plug of the first storage electrode contact hole is exposed;

forming a second conductive layer at a thickness entirely over the resulting structure from the previous step;

forming a spacer of a fourth insulating film at a side wall of the second storage electrode contact hole;

burying the second storage electrode contact hole with a third conductive layer;

subjecting the second and the third conductive layers and the fourth insulating film to planarization etch until the third insulating film is exposed; and eliminating the third insulating film and the fourth insulating film present within the second storage electrode contact hole, to create a storage electrode with a great surface area.

14. A method in accordance with claim 13, wherein said etch barrier layer is formed of a material which is different in etch selection ratio from the third insulating film and the second and the third conductive layers.

15. A method in accordance with claim 13, wherein said second conductive layer and said fourth insulating film are alternatively formed many times to make a multi-layer structure whose uppermost layer is conductive, prior to the formation of said third conductive layer.

* * * * *